(12) United States Patent
Oshima et al.

(10) Patent No.: US 8,101,939 B2  
(45) Date of Patent: Jan. 24, 2012

(54) GAN SINGLE-CRYSTAL SUBSTRATE AND METHOD FOR PRODUCING GAN SINGLE CRYSTAL

(75) Inventors: Yuichi Oshima, Tsuchirua (JP); Masatomo Shibata, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 12/010,888

(22) Filed: Jan. 30, 2008

(65) Prior Publication Data

US 2009/0090917 A1     Apr. 9, 2009

(30) Foreign Application Priority Data

Oct. 3, 2007 (JP) .................... 2007-260162

(51) Int. Cl.
*H01L 29/06* (2006.01)

(52) U.S. Cl. ...... 257/12; 257/94; 257/103; 257/E33.033

(58) Field of Classification Search .......... 257/79–81, 257/101–102, 51, E51.018, E51.022
See application file for complete search history.

(56) References Cited

U.S. PATENT DOCUMENTS

| 2008/0128706 A1 | 6/2008 | Fujiwara et al. |
| 2009/0155989 A1* | 6/2009 | Uematsu et al. ............ 438/507 |

FOREIGN PATENT DOCUMENTS

| JP | 2004-221480 | 8/2004 |
| JP | 2008-140893 A | 6/2008 |
| JP | 2008-297180 | 12/2008 |

OTHER PUBLICATIONS

Johnson, M.C., "Investigation of Microstructure and V-Defect Formation in InxGa1-xN/GaN MQW Grown Using Temperature-Gradient Metalorganic Chemical Vapor Deposition", Journal fo Electronic Materials, vol. 34, No. 5, 2005, pp. 605-611.
Japanese Office Action dated Nov. 24, 2009 with Engllish translation.
Japanese Submission of Information on Publications dated Nov. 4, 2009 with English translation.

* cited by examiner

*Primary Examiner* — Hoa B Trinh

(74) *Attorney, Agent, or Firm* — McGinn Intellectual Property Law Group, PLLC

(57) ABSTRACT

A GaN single-crystal substrate has a substrate surface in which polarity inversion zones are included. The number density of the polarity inversion zones in the substrate surface is not more than 20 $cm^{-2}$. A GaN single crystal production method includes introducing group III and V raw material gases on a substrate, and growing a GaN single crystal on the substrate. The growth temperature is within the range of not less than 1100° C. and not more than 1400° C., the group V to III raw material gas partial pressure ratio (V/III ratio) is within the range of not less than 0.4 and not more than 1, and the number density of polarity inversion zones in a surface of the substrate is not more than 20 $cm^{-2}$.

15 Claims, 11 Drawing Sheets

50a UNDERLYING SUBSTRATE

40a MASK

50b UNDERLYING SUBSTRATE

40b MASK

GAN SINGLE-CRYSTAL SUBSTRATE AND METHOD FOR PRODUCING GAN SINGLE CRYSTAL

The present application is based on Japanese patent application No. 2007-260162 filed on Oct. 3, 2007, the entire contents of which are incorporated herein by reference.

BACKGROUND OF THE INVENTION

1. Field of the Invention

This invention relates to a GaN single-crystal substrate and a method for producing a GaN single crystal. Particularly, the invention relates to a GaN single-crystal substrate and a method for producing a GaN single crystal, where abnormal growth can be suppressed.

2. Description of the Related Art

GaN-based compound semiconductors, such as group III nitride compound semiconductors of gallium nitrides (GaN), indium gallium nitrides (InGaN), aluminum gallium nitrides (AlGaN), etc. are used as materials for light-emitting devices, such as light-emitting diodes (LEDs), laser diodes (LDs), etc. GaN-based compound semiconductors are also used in elements for electronic devices because of their excellent heat- and environment-resistances.

As GaN free-standing substrate production methods used in such light-emitting devices or elements for electronic devices, there are developed ultrahigh-temperature high-pressure methods, flux methods, halide vapor phase epitaxy (HVPE) methods, etc., for example. Here, although GaN free-standing substrates are obtained by HVPE, epitaxially growing a specified compound semiconductor layer on a GaN free-standing substrate formed by conventional HVPE may cause the problem of abnormal growth causing partial pits and protrusions in substrate surface after epitaxial growth (See, e.g., Liliental-Weber et. al., Journal of Electronic Materials, May 2005, p. 605).

The GaN free-standing substrate obtained by the method disclosed by Liliental-Weber et. al. has an abnormally grown region in its surface. To epitaxially grow a light-emitting device structure on such a GaN free-standing substrate causes disturbance in the semiconductor layer epitaxially grown on the abnormally grown region. Accordingly, the GaN free-standing substrate obtained by the method disclosed by Liliental-Weber et al. causes difficulty in enhancing light-emitting device yields.

SUMMARY OF THE INVENTION

Accordingly, it is an object of this invention to provide a GaN free-standing substrate and a method for producing the same, which allow enhancement in device yields.

(1) According to one embodiment of the invention, a GaN single-crystal substrate comprises:

a substrate surface; and polarity inversion zones included in the substrate surface, wherein the number density of the polarity inversion zones in the substrate surface is not more than 20 $cm^{-2}$.

In the above embodiment (1), the following modifications and changes can be made.

The maximum outside diameter of the polarity inversion zones is not more than 1 mm.

(2) According to another embodiment of the invention, a GaN single crystal production method comprises the steps of:

introducing group III and V raw material gases on a substrate; and growing a GaN single crystal on the substrate, wherein the growth temperature is within the range of not less than 1100° C. and not more than 1400° C., the group V to III raw material gas partial pressure ratio (V/III ratio) is within the range of not less than, 0.4 and not more than 1, and the number density of polarity inversion zones in a surface of the substrate is not more than 20 $cm^{-2}$.

In the above embodiment (2), the following modifications and changes can be made.

(i) The growing step comprises the step of further adding hydrogen chloride (HCl) gas with a partial pressure of 0.01% to 0.1%.

(ii) The GaN single crystal production method further comprises the steps of:

forming a seed crystal layer on the substrate; and forming a mask on the seed crystal layer, wherein the growing step comprises growing a GaN single crystal on the seed crystal layer formed with the mask.

(iii) The mask forming step comprises forming the mask using a material that absorbs infrared wavelength light; and the growing step comprises epitaxially laterally overgrowing the GaN single crystal from a region on the seed crystal layer in which the mask is not formed.

(iv) The mask forming step comprises forming the mask from any one of TiN, ZrN, or HfN.

(v) The mask forming step comprises forming the mask with a size of not less than 20 nm and not more than 1 mm.

(vi) The growing step comprises the steps of:

interrupting growth of the GaN single crystal;

during the growth interrupting step, adding hydrogen chloride gas with a partial pressure of 0.001% to 0.05% and heating the GaN single crystal within the temperature range of 700° C. to 900° C.; and after the heating, resuming growth of the GaN single crystal.

According to the GaN free-standing substrate production method in the embodiment of this invention, it is possible to produce and provide a GaN free-standing substrate that allows devices, such as light-emitting devices, to be enhanced in yield by reducing size and number density of inversion domains occurring in the GaN single crystal.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Embodiment

Figure 1A:
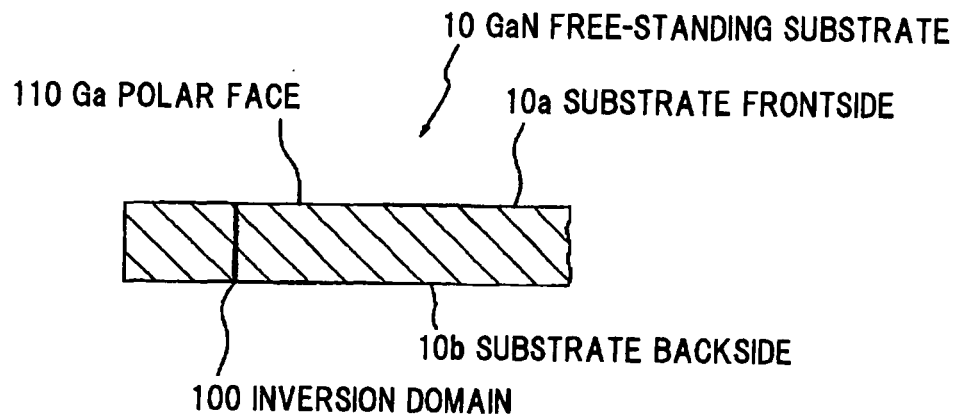
FIG. 1A is a partial cross-sectional view showing a GaN free-standing substrate in an embodiment according to the present invention.
Figure 1B:
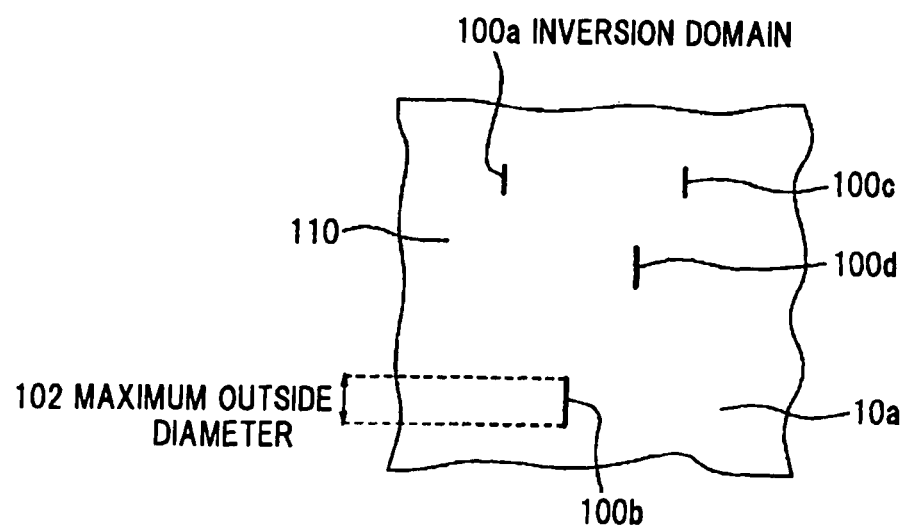
FIG. 1B is a partial enlarged view showing a frontside of the GaN free-standing substrate in the embodiment according to the present invention.

FIG. 1A is a partial cross-sectional view showing a GaN free-standing substrate in an embodiment according to the present invention, and FIG. 1B is a partial enlarged view showing a frontside of the GaN free-standing substrate in the embodiment according to the present invention.

GaN Free-Standing Substrate 10

The GaN free-standing substrate 10 in the embodiment according to the present invention is formed with a substantially circular top view. As one example, the GaN free-standing substrate 10 is formed with an approximately 50.8 mm (2 inch) diameter circular top view, and approximately 1 mm thick. And, as shown in FIG. 1A, the GaN free-standing substrate 10 in this embodiment has an inversion domain 100 as a polarity inversion zone that substantially extends from Ga polar face 110-exposed frontside 10a to backside 10b of the substrate. The inversion domain 100 refers to a region whose polarity is inverted relative to its surrounding crystal. Accordingly, the inversion domain 100 of the GaN free-standing substrate 10 in this embodiment is a region with an N polarity.

Specifically, the GaN free-standing substrate 10 has a specified number density of specified average length inversion domains 100. More specifically, the GaN free-standing substrate 10 is formed such that the ratio of the sum of the respective areas of the plural inversion domains 100 to the total area of the substrate frontside 10a is not more than 2%, and that the number density of the inversion domains 100 within the substrate frontside 10a is not more than 20 $cm^{-2}$.

Also, as shown in FIG. 1B, the plural inversion domains 100 (e.g., inversion domains 100a, 100b, 100c, 100d, etc.) are formed apart from each other on the substrate frontside 10a. Also, the GaN free-standing substrate 10 is formed such that the plural inversion domains 100 formed in the substrate frontside 10a are sized to a maximum diameter (maximum outside diameter) of not more than 1 mm. The inversion domains 100 are formed in various shapes including substantially circular, amorphous amoebic, line shapes, etc. Accordingly, the maximum outside diameter of the inversion domains 100 in this embodiment refers to a maximum portion of outside dimensions of the inversion domains 100.

GaN Polarity

Here, the GaN polarity is explained. GaN has a wurtzite crystalline structure. The wurtzite crystalline structure does not have inversion symmetry with respect to its c-plane. Accordingly, the wurtzite crystalline structure has different polarities with respect to c-axis directions, referred to as Ga polar face or Ga face for + c-axis direction and N polar face or N face for – c-axis direction.

And, the wurtzite crystalline structure comprises a basic tetrahedral structure in which one atom is surrounded by 4 atoms different from that atom. Assuming that the tetrahedral structure has a Ga atom in its center, and that its crystal is placed in such a direction as to arrange 3 bonds with N atoms on a lower side relative to the Ga atom, an upper direction is the + c-axis direction. In this definition, the upper face of that crystal is the Ga polar face, and the face opposite the Ga polar face is the N polar face. And, when the N polar face is mixed in the Ga polar face, the region in which the N polar face exists is an inversion domain.

Further, the physical and chemical properties of GaN are different in the Ga polar face and the N polar face. For example, the hardness of the Ga polar face is greater than the hardness of the N polar face, and the etching rate of the Ga polar face is very smaller than the etching rate of the N polar face. Namely, the Ga polar face is more robust and chemically stable than the N polar face. Also, epitaxial growth on GaN crystals tends to make planar epitaxial layer surface formed on the Ga polar face, but form protrusions and pits in epitaxial layer surface formed on the N polar face. Accordingly, when forming devices such as light-emitting diodes (LEDs), laser diodes (LDs), etc., a specified epitaxial layer is formed on the Ga polar face of GaN.

In this case, when the N polar face is included in the Ga polar face, i.e., when the inversion domain 100 is included in the Ga polar face, abnormal growth occurs on the region in which the inversion domain 100 exists. The growing speed of the epitaxial growing crystal is determined by the competition between adsorption and desorption of atoms of the raw material, and therefore the crystal growing speed on the more chemically unstable inversion domain 100 than the Ga polar face is smaller than the crystal growing speed on the Ga polar face. This is considered to cause pits on the inversion domain 100 during epitaxial growth. Also, the raw material, which does not adsorb onto the inversion domain 100, is supplied locally to a periphery of the inversion domain 100. This causes an increase in the crystal growing speed on the periphery of the inversion domain 100, and therefore the epitaxial layer on the pit periphery of the inversion domain 100 is formed to protrude therefrom.

Inversion Domain 100 Evaluation Method

The detection of an inversion domain 100 that exists in a micro region may be evaluated, for example, by using transmission electron microscope (TEM) convergent beam electron diffraction (CBED) and determining a polarity of GaN crystal surface.

The distribution of inversion domains 100 that disperse in a wide region such as an approximately 50.8 mm diameter region is evaluated using a differential interference microscope, and a scanning electron microscope. Concretely, the surface of a ground GaN free-standing substrate is observed using a differential interference microscope, and a scanning electron microscope. In this case, specified depth pits are observed. These pits correspond to inversion domains 100 and therefore the distribution of these pits is observed. This allows evaluation of the distribution of inversion domains 100 distributed on the GaN free-standing substrate to be observed.

Such an evaluation method is that found and established by the present inventor as follows. Namely, when the surface of a ground GaN free-standing substrate is observed using a differential interference microscope and a scanning electron microscope, a pit with a depth on the order of a few tens of nm may be observed. The present inventor has found that when determining a polarity inside this pit, the region inside the pit is of the N polar face. That is, the present inventor has found that such a pit and an inversion domain correspond one-to-one to each other. This allows inversion domains distributed in a wide range to be evaluated by the convenient means using the differential interference microscope and scanning electron microscope.

Inversion Domain 100 Area Ratio

As a GaN free-standing substrate has a larger area ratio of inversion domains 100 that is the ratio of the total area of the plural inversion domains 100 of substrate frontside 10a to the area of the substrate frontside 10a, the yield of devices such as light-emitting devices formed from that GaN free-standing substrate decreases. It is typically few for the area ratio of inversion domains 100 to exceed 10%, but in the embodiment of this invention the GaN free-standing substrate 10 is formed to make the area ratio of inversion domains 100 small. In this embodiment, the GaN free-standing substrate 10 is formed to have an inversion domain 100 area ratio of not more than a specified value, specifically, not more than 2%.

Figure 2:
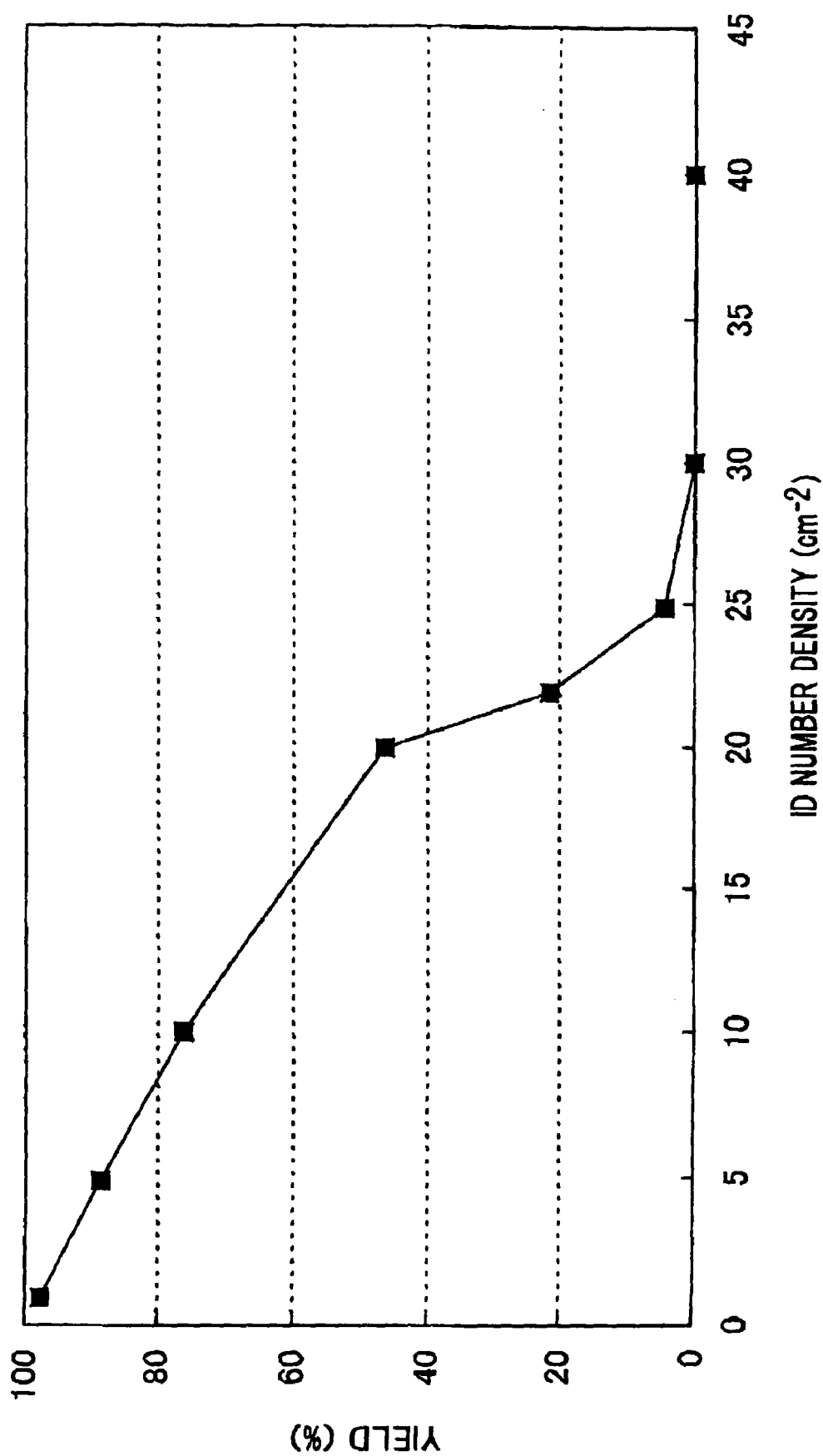
FIG. 2 is a diagram showing a correlation between inversion domain (ID) number density and yield.

FIG. 2 shows a correlation between inversion domain (ID) number density and yield.

Inversion Domain 100 Number Density

Even when the above inversion domain 100 area ratio is not more than a specified value, if a GaN free-standing substrate has a substrate frontside 10a inversion domain 100 number density of larger than a specified value, the yield of devices such as light-emitting devices formed from that GaN free-standing substrate decreases.

Namely, for example, assuming that forming a specified device structure on a GaN free-standing substrate with the inversion domain 100 area ratio of 1% is followed by cutting a 0.5 mm² size chip out from this free-standing substrate, the cut chip is defective when including the inversion domains 100. In this case, comparing the cases where the inversion domains 100 are concentrated in a specified position on the GaN free-standing substrate and where the inversion domains 100 are dispersed uniformly or to some extent on the GaN free-standing substrate, the yield of the cut chip decreases more when the inversion domains 100 are dispersed on the GaN free-standing substrate. Accordingly, the GaN free-standing substrate 10 in this embodiment is formed to have a substrate frontside 10a inversion domain 100 number density of not more than a specified value.

Here, when epitaxially growing and forming a specified device structure on the substrate frontside 10a of the GaN free-standing substrate 10, a peripheral portion of the inversion domain 100 protrudes due to abnormal growth on the inversion domain 100. This causes a decrease in a device production process yield due to the presence of the inversion domain 100 after epitaxial growth of the specified device structure on the GaN free-standing substrate 10.

Also, the inversion domain 100 may be accompanied by a high impurity concentration region on its periphery having a width on the order of 10 to 100 times the diameter of the inversion domain 100. This is considered to be because the inside wall of the pit formed due to a growing speed difference between the Ga polar face and N polar face during crystal HVPE growth tends to take in the impurity compared to the c plane. This high impurity concentration region remains even when grinding the GaN free-standing substrate surface to make the pit planar.

Accordingly, when forming a specified yield on the high impurity concentration region, the device formed on the high impurity concentration region is different in properties from the device formed on a region (sound portion) in which no high impurity concentration region exists, and its yield decreases. For example, when the number density of the inversion domains 100 is 25 cm$^{-2}$, the yield calculated from area is 87.5% on average, but is insufficient for yield enhancement when forming an actual yield, due to inversion domain 100 peripheral protrusions and the presence of the high impurity concentration region, as explained above.

FIG. 2 shows the relationship between the number density on a substrate frontside 10a of an inversion domain (ID) 100 smaller than 0.5 mm² chip size and yield when cutting 0.5 mm² size chips out of a GaN free-standing substrate with inversion domains 100 having their respective number densities. As seen from FIG. 2, the present inventor has found that the yield decreases sharply when the number density of the inversion domains 100 exceeds 20 cm$^{-2}$. Namely, the present inventor has found that the yield decreases sharply below 45% when the number density of the inversion domains 100 exceeds 20 cm$^{-2}$. Accordingly, in the embodiment of this invention, the GaN free-standing substrate 10 is formed to have a substrate frontside 10a inversion domain 100 number density of not more than 20 cm$^{-2}$.

As seen from FIG. 2, when the ID number density is 1 cm$^{-2}$, the yield is 98%, and when the ID number density is 5 cm$^{-2}$, the yield is 89%, and when the ID number density is 10 cm$^{-2}$, the yield is 76%, and when the ID number density is 20 cm$^2$, the yield is 47%, and when the ID number density is 22 cm$^{-2}$, the yield is 22%, and when the ID number density is 25 cm$^{-2}$, the yield is 5%, and when the ID number density is 30 cm$^{-2}$ and 40 cm$^{-2}$, the yield is substantially 0%.

Figure 3:
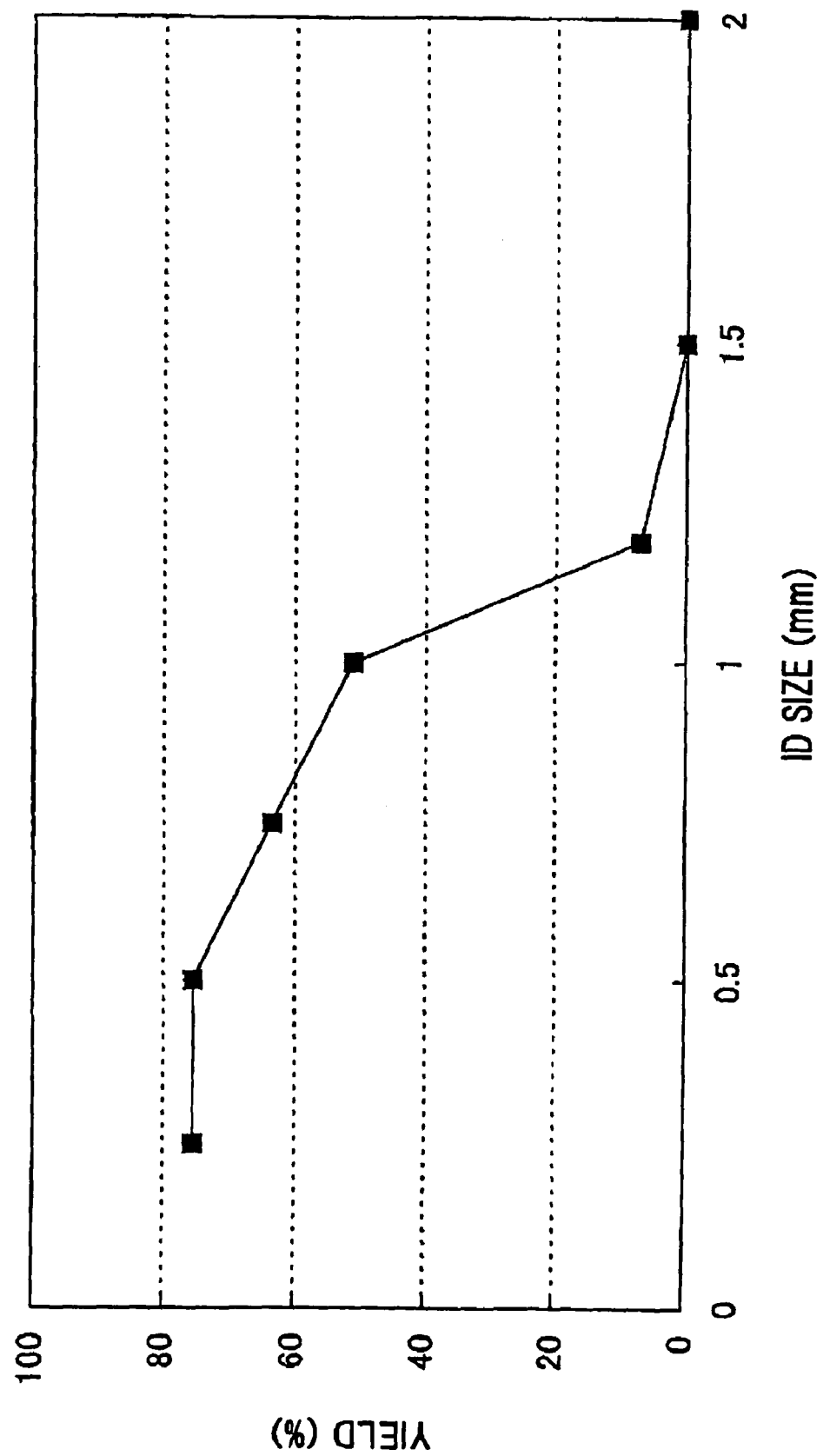
FIG. 3 is a diagram showing a correlation between inversion domain (ID) size and yield, when the inversion domain (ID) number density is approximately 10 $cm^{-2}$.

FIG. 3 shows a correlation between inversion domain (ID) size and yield, when the inversion domain (ID) number density is approximately 10 cm$^{-2}$. As seen from FIG. 3, when the ID size is 0.25 mm, the yield is 76%, and when the ID size is 0.5 mm, the yield is 76%, and when the ID size is 0.75 mm, the yield is 64%, and when the ID size is 1 mm, the yield is 51%, and when the ID size is 1.2 mm, the yield is 7%, and when the ID size is 1.5 mm and 2 mm, the yield is substantially 0%.

Inversion Domain 100 Maximum Outside Diameter

When the inversion domain 100 is in a very long and thin shape, even if the inversion domain 100 area ratio and number density are appropriate, the yield of cutting chips out of a GaN free-standing substrate may decrease. For example, when the size of the inversion domain 100 exceeds chip size diameter, the yield decreases calculationally in proportion to the length of the inversion domain 100. In an actual process, the yield decreases very much when the size of the inversion domain 100 exceeds 1 mm.

Referring to FIG. 3, the present inventor has found that when the inversion domain 100 number density is approximately 10 cm$^{-2}$, and the inversion domain 100 size (ID size) exceeds 1 mm, the yield decreases sharply. Namely, the present inventor has found that the yield decreases sharply below 50% when the size of the inversion domain 100 exceeds 1 mm. Accordingly, in the embodiment of this invention, the GaN free-standing substrate 10 is formed to have a substrate frontside 10a inversion domain 100 size of not more than 1 mm. When the inversion domain 100 size is not more than 0.5 mm, the yield is on the order of approximately 75%.

FIGS. 4A-4E show a process for producing a GaN free-standing substrate in the embodiment according to the present invention. Also, FIGS. 5A and 5B are a typical top view showing an underlying substrate in the embodiment according to the present invention.

GaN Free-Standing Substrate 10 Production Process

Figure 4A:
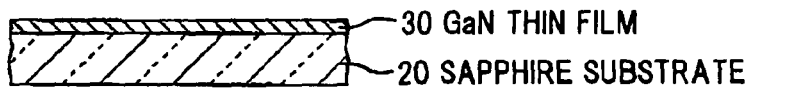
FIGS. 4A-4E are diagrams showing a process for producing a GaN free-standing substrate in the embodiment according to the present invention.
Figure 5A:
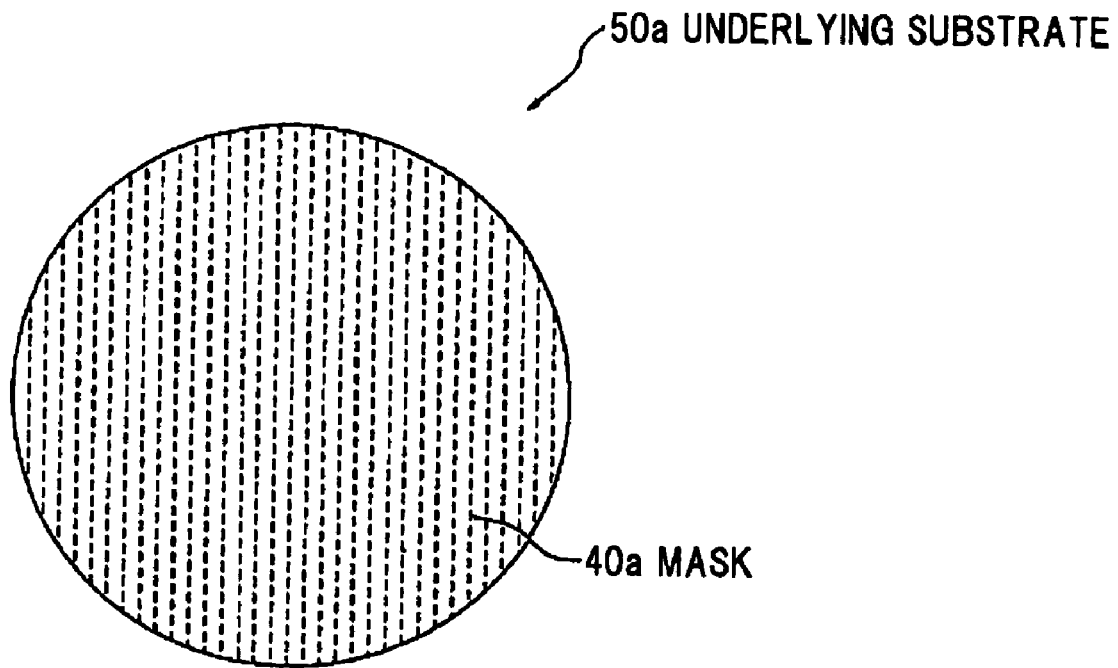
FIGS. 5A and 5B are a typical top view showing an underlying substrate in the embodiment according to the present invention.
Figure 5B:
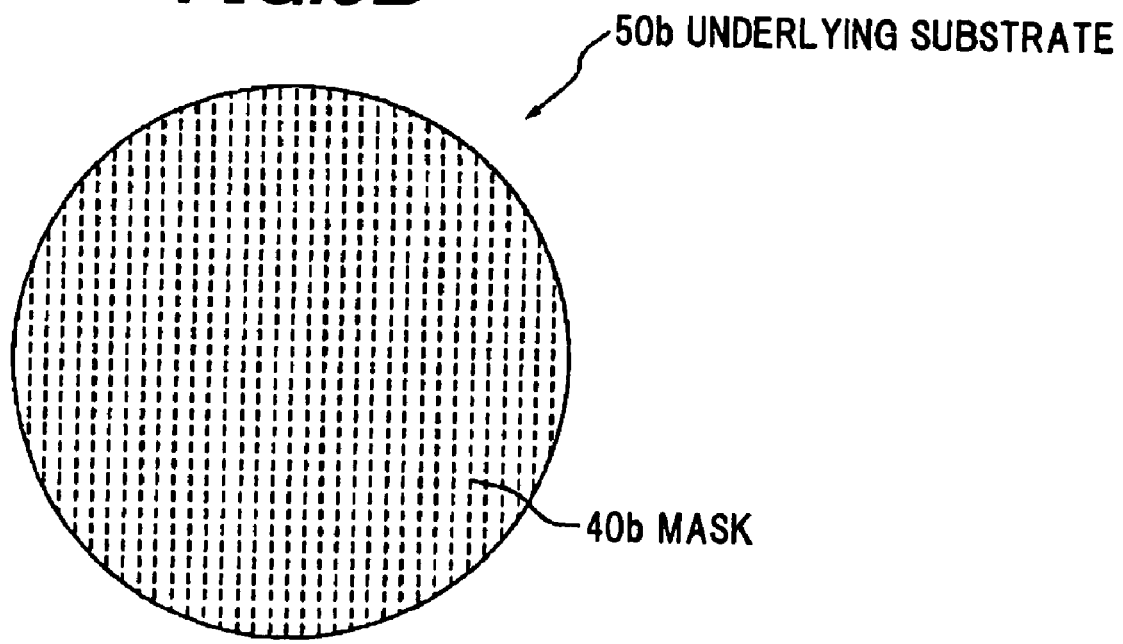

First, as shown in FIG. 4A, on a sapphire substrate 20 having a (0001) plane, i.e., a c-plane, is formed a specified thickness GaN thin film 30 as a seed crystal layer using metal organic vapor phase epitaxy (MOVPE). As one example, there is formed a 1 μm thick GaN thin film 30. The diameter of the sapphire substrate 20 is approximately 50.8 mm (2 inch) as one example. A GaN seed crystal substrate may be used in place of a hetero-substrate, such as the sapphire substrate 20. Namely, the GaN thin film 30 may be formed on the GaN seed crystal substrate using MOVPE.

Figure 4B:
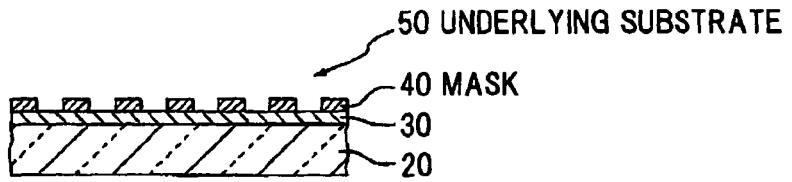

This is followed by forming a mask layer formed of a specified material on the GaN thin film 30. As one example, there is formed a SiO$_2$ layer as the mask layer using thermal CVD. Subsequently, as shown in FIG. 4B, the mask layer formed is processed into a specified shape mask 40 using photolithography. Specifically, the mask layer is processed to array plural 10 μm wide, 20 μm long masks 40 longitudinally and transversely at a pitch of 5 μm on the GaN thin film 30. This results in an underlying substrate 50 in this embodiment.

Namely, as shown in FIG. 5A, the underlying substrate 50 is formed that has the plural specified size and shape masks 40 dotted at a specified pitch along virtual lines on the GaN thin film 30. As shown in FIG. 5A as one example, the masks 40 in the embodiment of this invention are arranged such that the plural masks 40 arranged at a specified pitch along first lines and the plural masks 40 arranged at a specified pitch along second lines adjacent to the first lines are alternate to each other.

As shown in FIG. 5B, masks 40 in a modified embodiment of this invention may be arranged such that the plural masks 40 arranged at a specified pitch along first lines and the plural masks 40 arranged at a specified pitch along second lines adjacent to the first lines are parallel to each other.

Subsequently, the underlying substrate 50 formed is introduced into an HVPE apparatus. And, using specified growth conditions, a GaN single crystal growth is initiated from a region on the masks 40-forming side GaN thin film 30 which has no formed masks 40. As one example, the concrete growth conditions are as follows.

Namely, H$_2$ is used as carrier gas, and GaCl formed of a specified concentration of hydrogen chloride (HCl) gas and Ga metal and NH$_3$ are used as raw material gas. The flow rates of GaCl and NH$_3$ are both set to 100 sccm (group V-III raw material partial pressure ratio (V/III ratio)=1). And the growth temperature is set to 1100° C., and the growth pressure 100 kPa (the first growth conditions).

Figure 4C:
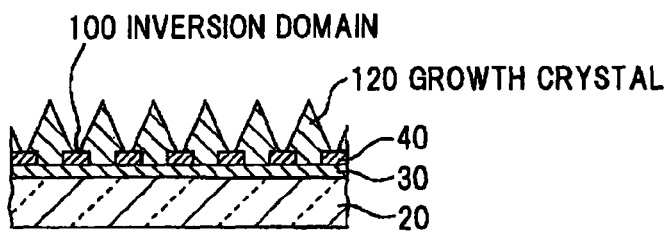

When growing a GaN single crystal in such first growth conditions, as shown in FIG. 4C, a growth crystal 120 as the GaN single crystal having a substantially triangular cross section is grown from the GaN thin film 30 region having no formed masks 40. In this case, an inversion domain 100 nucleus with an N polarity is produced on some masks 40.

This is followed by changing the GaN single crystal growth conditions in the HVPE apparatus to second growth conditions below and growing a growth crystal 122 as the GaN single crystal. As one example, the GaN single crystal is grown in both horizontal and normal directions to sapphire substrate 20 surface until the total thickness of the GaN single crystal grown in the HVPE apparatus reaches 1 mm. Namely, the growth crystal 122 is the single crystal formed by epitaxial lateral overgrowth (ELO).

As one example, the second growth conditions are as follows. Namely, H$_2$ is used as carrier gas, and GaCl formed of a specified concentration of HCl gas and Ga metal and NH$_3$ are used as raw material gas. The flow rates of GaCl and NH$_3$ are both set to 500 sccm (V/III ratio=1). And the growth temperature is set to 1100° C., and the growth pressure 100 kPa (the second growth conditions). The opposite side of the sapphire substrate 20 of the growth crystal 122 is a substantially planar surface 122a. The planar surface 122a is partially formed with a pit 122b caused by inversion domain 100.

Growing the growth crystal 122 is followed by taking the sapphire substrate 20 with the growth crystal 122 out from the HVPE apparatus. And specified power YAG laser is applied from the sapphire substrate 20 side. Laser application causes thermal decomposition of GaN around the interface between the sapphire substrate 20 and the growth crystal 122. This causes a separation (laser lift off) of the underlying substrate 50 and the growth crystal 122 (HVPE-GaN thick film) as the GaN single crystal grown in the HVPE apparatus.

Subsequently, both sides of the GaN thick film released and obtained from the underlying substrate 50 are ground and/or polished. This results in a GaN free-standing substrate 10, as shown in FIG. 4E. The GaN free-standing substrate 10 has a Ga polar face 110-exposed frontside 10a, and a backside 10b opposite the frontside 10a. Also, the GaN free-standing substrate 10 has an inversion domain 100 with a specified shape and specified number density that substantially extends from the frontside 10a to backside 10b. As one example, the GaN free-standing substrate 10 in this embodiment has an inversion domain 100 with the number density of 12 cm$^{-2}$ and the average length of 2 μm.

When forming a compound semiconductor stacked layer structure with a specified laser structure on this GaN free-standing substrate 10, the surface of the compound semiconductor stacked layer is substantially planar. And, when producing a laser diode from the GaN free-standing substrate 10 formed with the compound semiconductor stacked layer structure, its yield is approximately 75%.

Here, to inhibit the occurrence of the inversion domain 100, it is preferable that the GaN free-standing substrate production method in the embodiment of this invention employ conditions below. Herein, preferred conditions are explained corresponding to the steps of FIGS. 4A-4E.

Seed Crystal Layer Production

First, as shown in FIG. 4A, on a 2 inch-diameter sapphire substrate 20 having a (0001) plane on its frontside is formed a GaN thin film 30 as a seed crystal layer. As one example, a 1 μm thick GaN thin film 30 is formed on the frontside of the sapphire substrate 20 using MOVPE. In FIG. 4A, the GaN thin film 30 is formed directly on the sapphire substrate 20, but a low-temperature buffer layer (not shown) may be formed on the sapphire substrate 20 that relaxes the lattice mismatch between the GaN thin film 30 and the sapphire substrate 20. For example, GaN is formed on the sapphire substrate 20 to have a film thickness on the order of a few tens of nm at approximately 500° C. growth temperature, to thereby form the low-temperature buffer layer. And, prior to growing the GaN thin film 30, the sapphire substrate 20 with the low-temperature buffer layer is heated at approximately 1000° C.

Here, the low-temperature buffer layer may also be formed from an AlN thin film. When the low-temperature buffer layer is formed from the AlN thin film, the AlN thin film is formed on the sapphire substrate 20 to have a film thickness on the order of approximately 50 nm at approximately 600° C. growth temperature. And, prior to growing the GaN thin film 30, the sapphire substrate 20 with the AlN thin film is heated at approximately 1040° C.

ELO Growth Conditions

Figure 4D:
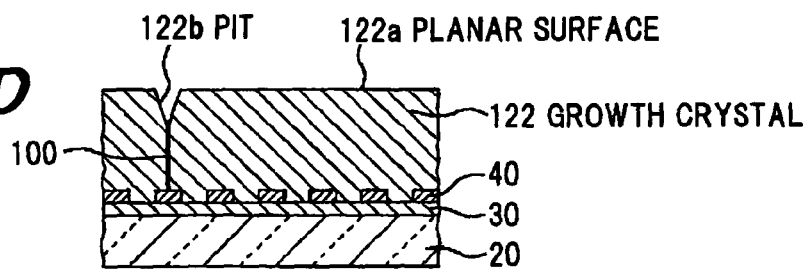
Figure 4E:
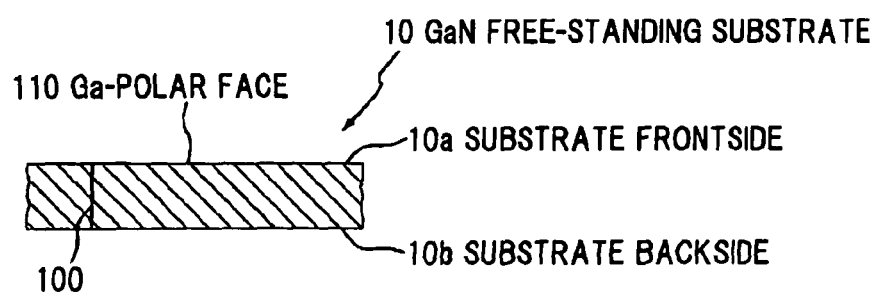

In GaN single crystal growth by ELO with the HVPE apparatus as shown in FIGS. 4C and 4D, masks are first formed on the GaN thin film 30 serving as a seed crystal layer. These masks are typically formed of SiO$_2$, or the like. The SiO$_2$ masks have no polarity, and therefore when a GaN single-crystal nucleus is produced on the masks, it is difficult to control and align in a fixed direction the polarities of the GaN crystal formed on this nucleus. Accordingly, it is preferable to employ the following ELO growth conditions.

ELO Growth Conditions: Growth Conditions for No N-Face Crystal being Likely to be Grown FIG. 6 shows a relationship between V/III ratios and inversion domain (ID) density in GaN single crystal growth in an HVPE apparatus in the embodiment according to the present invention.

The V/III ratio when growing a GaN single crystal on the underlying substrate 50 in the HVPE apparatus is varied in the range from 0.4 to 2, and the number density of inversion domains 100 included in the grown GaN single crystal is compared. Also, in each V/III ratio, the growth temperature is varied from 1000° C. to 1400° C., and the number density of inversion domains 100 included in the grown GaN single crystal is compared. The other growth conditions are substantially the same as explained above in FIG. 4 and are therefore omitted.

Figure 6:
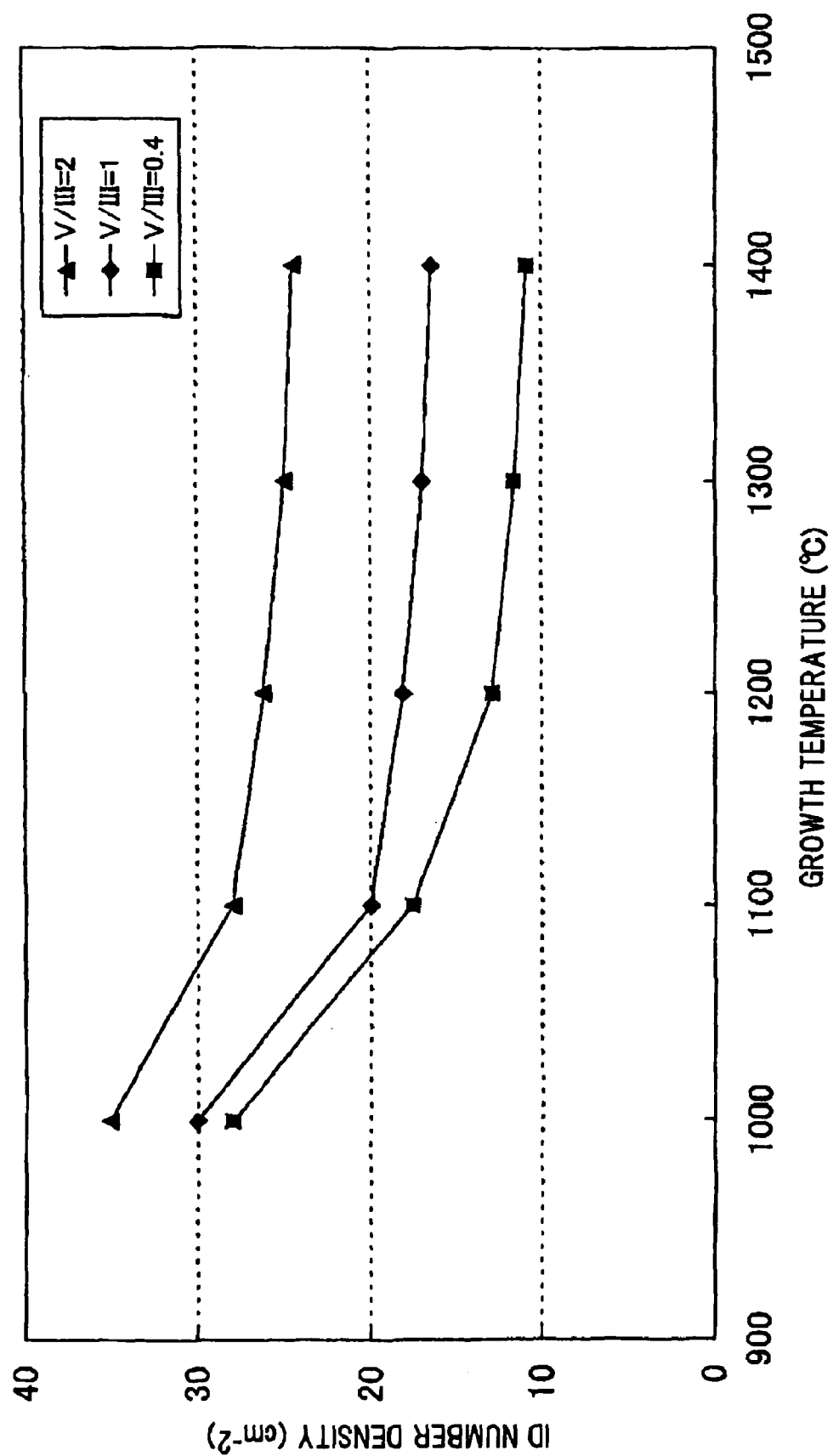
FIG. 6 is a diagram showing a relationship between V/III ratios and inversion domain (ID) density in GaN single crystal growth in an HVPE apparatus in the embodiment according to the present invention.

As a result, as seen from FIG. 6, the higher the growth temperature and the smaller the V/III ratio, the number density of inversion domains 100 included in the obtained GaN single crystal decreases. Particularly, it is found that when the V/III ratio is within the range from 0.4 to 1.0, and the growth temperature is within the range from 1100° C. to 1400° C., the number density of inversion domains 100 is not more than 20 $cm^{-2}$.

Namely, when growing a GaN single crystal on the underlying substrate 50 put in the HVPE apparatus, it is preferable to employ the high temperature and low V/III ratio growth conditions. Specifically, the growth temperature is set within the range from 1100° C. to 1400° C., and the V/III ratio is set within the range of not less than 0.4 and not more than 1.0. V/III ratios of less than 0.4 may cause Ga droplets in growing GaN crystal surface. Also, high growth temperatures exceeding 1400° C. may cause difficulty obtaining a specified growing speed required for producing the GaN free-standing substrate 10, and it is therefore preferable to employ the above growth temperature from the point of view of economy.

ELO Growth Conditions: Growth Conditions for No Nucleus being Likely to be Produced on Masks 40

Figure 7:
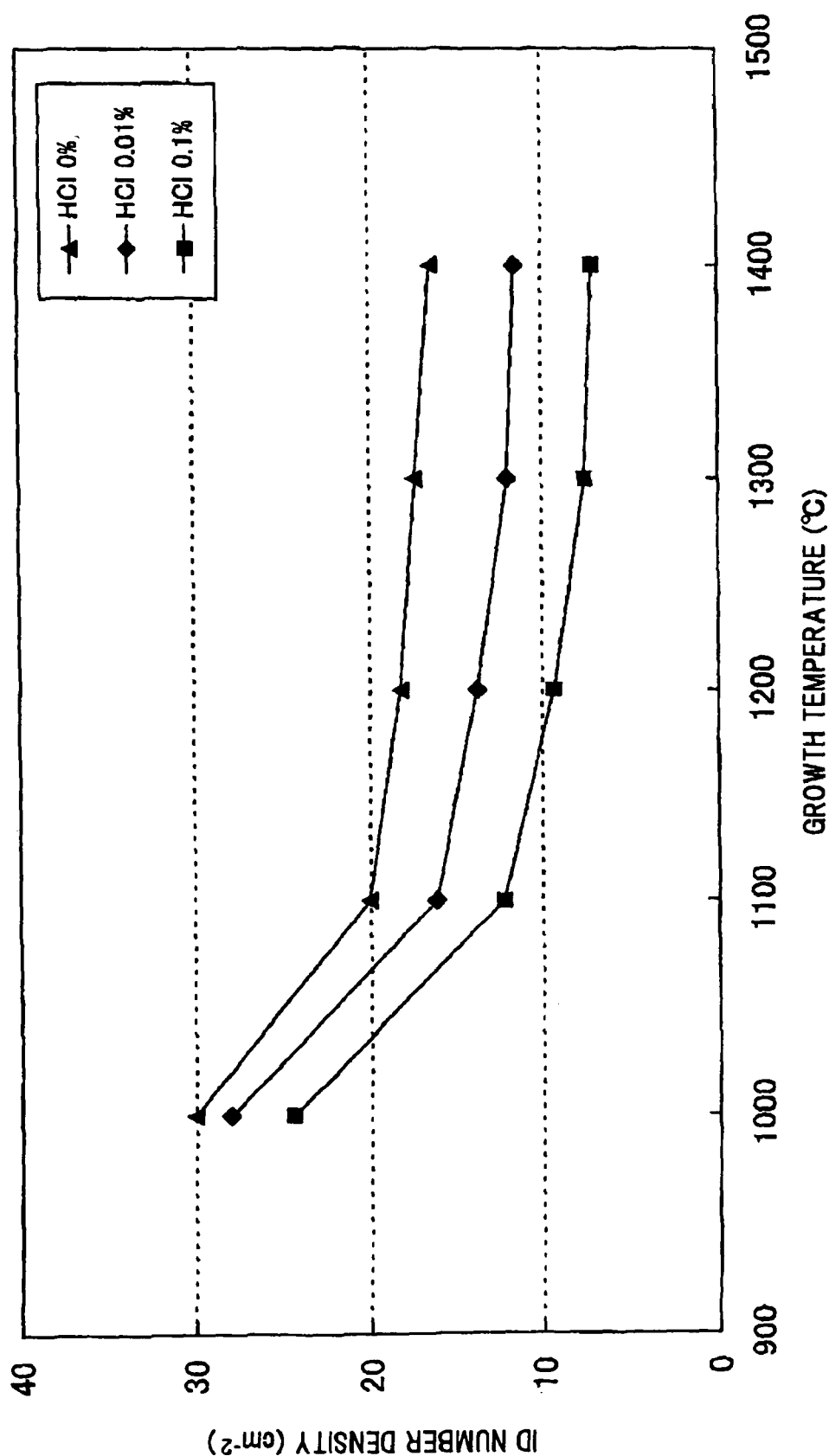
FIG. 7 is a diagram showing a relationship between added HCl quantities and inversion domain (ID) density in GaN single crystal growth in an HVPE apparatus in an embodiment according to the invention.

FIG. 7 shows a relationship between added HCl quantities and inversion domain (ID) density in GaN single crystal growth in an HVPE apparatus in an embodiment according to the invention.

In the step of FIG. 4C, the added HCl quantity when growing a GaN single crystal on the underlying substrate 50 in the HVPE apparatus is varied in the range from 0 to 0.1%, and the number density of inversion domains 100 included in the grown GaN single crystal is compared. Also, in each added HCl quantity, the growth temperature is varied from 1000° C. to 1400° C., and the number density of inversion domains 100 included in the grown GaN single crystal is compared. The other growth conditions are substantially the same as explained above in FIG. 4 and are therefore omitted.

As a result, as seen from FIG. 7, the higher the growth temperature and the more the added HCl quantity, the number density of inversion domains 100 included in the obtained GaN single crystal decreases. Particularly, it is found that when the added HCl quantity is within the range from 0.01% to 0.1%, and the growth temperature is within the range from 1100° C. to 1400° C., the number density of inversion domains 100 is not more than approximately 17 $cm^{-2}$.

Namely, when growing a GaN single crystal on the underlying substrate 50 put in the HVPE apparatus, it is preferable to inhibit supersaturation, i.e., GaN growing speed between when growing a GaN single crystal on the underlying substrate 50 with masks 40 and when covering the masks 40 with the GaN single crystal. The GaN growing speed can be inhibited by making the growth temperature high, and introducing an etching gas, such as HCl, into the HVPE apparatus. Specifically, the growth temperature of the GaN single crystal in the HVPE apparatus is set within the range from 1100° C. to 1400° C., and the HCl partial pressure is set within the range of 0.01% to 0.1%. Growth temperatures exceeding 1400° C., or HCl concentrations higher than 0.1% may cause difficulty obtaining a growing speed that meets economy.

ELO Growth Condition: Mask 40 Size

Figure 8:
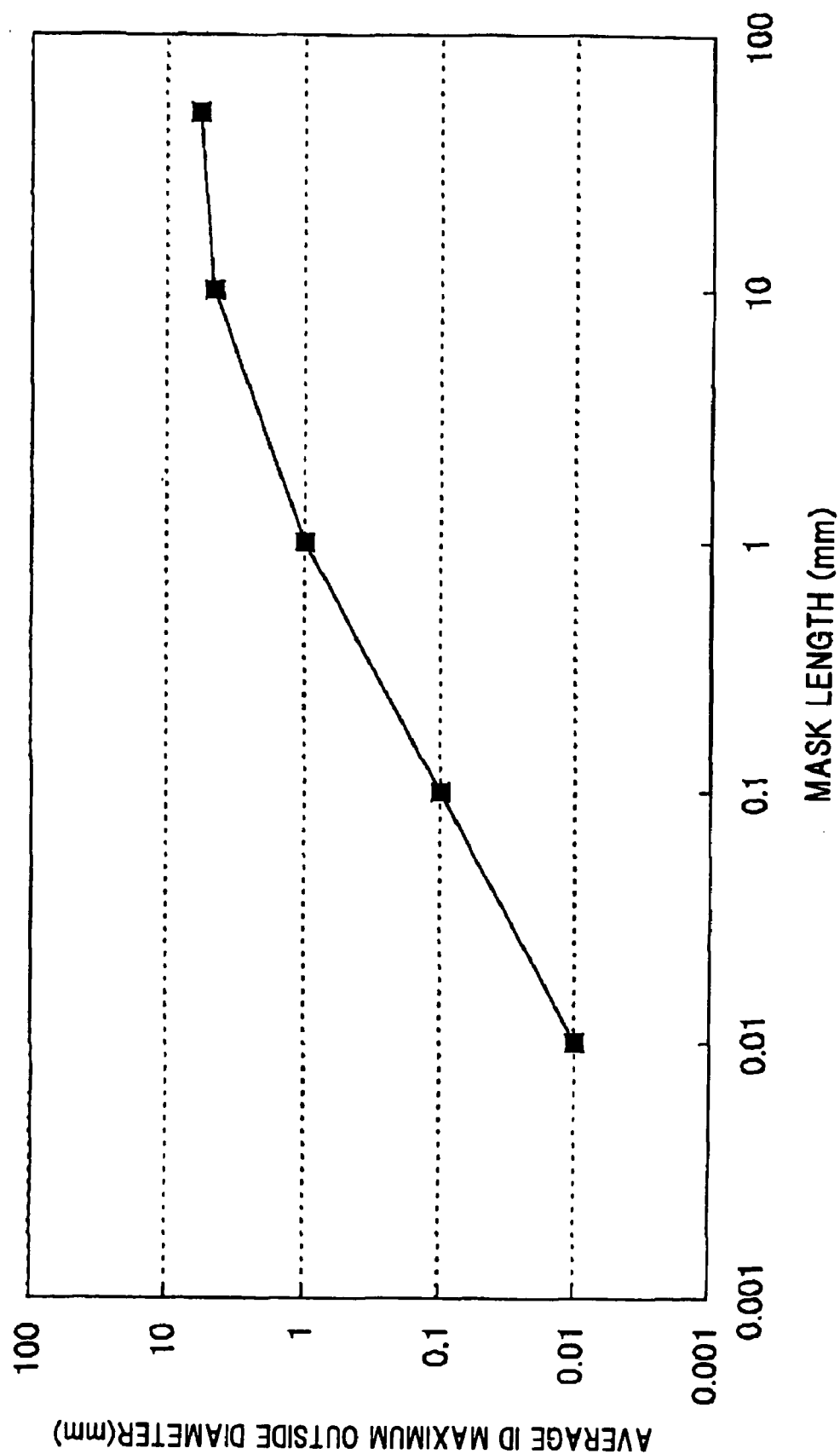
FIG. 8 is a diagram showing average inversion domain (ID) maximum outside diameter when varying mask length in the embodiment.

FIG. 8 shows average inversion domain (ID) maximum outside diameter when varying mask length in the embodiment.

Varying mask 40 length, plural underlying substrates 50 are produced. Specifically, the mask 40 length is varied in the range from 0.01 μm to 50 mm. And, a GaN single crystal is grown on each of the plural underlying substrates 50 in the HVPE apparatus. And, observing the surfaces of the obtained GaN single crystals, and measuring inversion domain 100 lengths in top view, an average length is computed for each mask 40 length. The other growth conditions are substantially the same as explained above in FIG. 4 and are therefore omitted.

As a result, as shown in FIG. 8, it is found that by making the mask length not more than 1 mm, the average inversion domain 100 maximum outside diameter decreases sharply. At mask lengths of not more than 0.02 μm (20 nm), however, no desired dislocation decrease effect is obtained. Accordingly, it is preferable that the mask 40 size, i.e., the mask length be formed within the range of not less than 20 nm and not more than 1 mm.

Namely, when growing a GaN single crystal on the underlying substrate 50 put in the HVPE apparatus, it is preferable that the mask 40 size be small. Specifically, it is preferable that the mask 40 length is set in the range of not less than 20 nm and not more than 1 mm. This is because when inversion domain 100 nuclei are produced on the masks 40, mask 40 sizes greater than a specified value may cause the nuclei produced on the masks 40 to be linked to each other and developed into a large inversion domain 100.

As one example, stripe masks conventionally used have a width on the order of a few μm, but the longitudinal shape of the stripe masks extends from one end of the wafer to the other. Namely, the maximum length of the stripe masks conventionally used is on the order substantially equal to the diameter of the wafer in which the masks are formed. In such conventional stripe masks, a large inversion domain 100 tends to be developed. Accordingly, it is preferable to make the mask 40 size small and thereby inhibit the development of a large inversion domain 100. At mask 40 sizes of not more than 0.02 μm, no dislocation decrease effect is likely to be obtained. Also, the mask 40 width is on the same order as that of conventional stripe masks.

ELO Growth Condition: Mask 40 Material

Table 1 shows relationships between mask materials and inversion domain number density in the embodiment of this invention.

TABLE 1

| MASK MATERIAL | ID NUMBER DENSITY ($cm^{-2}$) |
| --- | --- |
| $SiO_2$ | 19.5 |
| SiN | 18.8 |
| TiN | 5.8 |

TABLE 1-continued

| MASK MATERIAL | ID NUMBER DENSITY (cm$^{-2}$) |
|---|---|
| ZrN | 7.2 |
| HfN | 8.8 |

Temp. = 1100° C., V/III = 1, WITHOUT ADDED HCl

In the step of FIG. 4B, mask 40 materials are formed using plural materials respectively shown in Table 1. Namely, the mask 40 materials each are formed of SiO$_2$, SiN, TiN, ZrN, or HfN. And, using masks 40 formed of each material, the steps of FIGS. 4B-4E result in a GaN free-standing substrate for each material. The other growth conditions are substantially the same as explained above in FIG. 4 and are therefore omitted.

As a result, as seen from Table 1, the inversion domain 100 number density is substantially deceased when using the masks 40 formed of TiN, ZrN, or HfN that absorbs infrared wavelength light at a specified ratio, compared to when using the masks 40 formed of SiO$_2$ or SiN transparent to infrared wavelength light. Accordingly, it is preferable to use TiN, ZrN, or HfN as a material for forming the masks 40 when producing a GaN free-standing substrate in the embodiment of this invention.

Namely, it is preferable that the masks 40 in the embodiment of this invention be formed of a material that absorbs infrared rays at a specified ratio, i.e., whose temperature tends to be increased by thermal radiations. When masks 40 are formed of a material whose temperature tends to be increased by thermal radiations, the masks 40 are heated by partial radiation of heat supplied from the HVPE apparatus to underlying substrate 50, and growth crystal 120 or 122 in GaN single crystal growth in the HVPE apparatus. And, the mask 40 temperature increases. This allows inhibiting the production of a nucleus on the masks 40 that develops into an inversion domain 100.

Etching Condition Dependency

Figure 9:
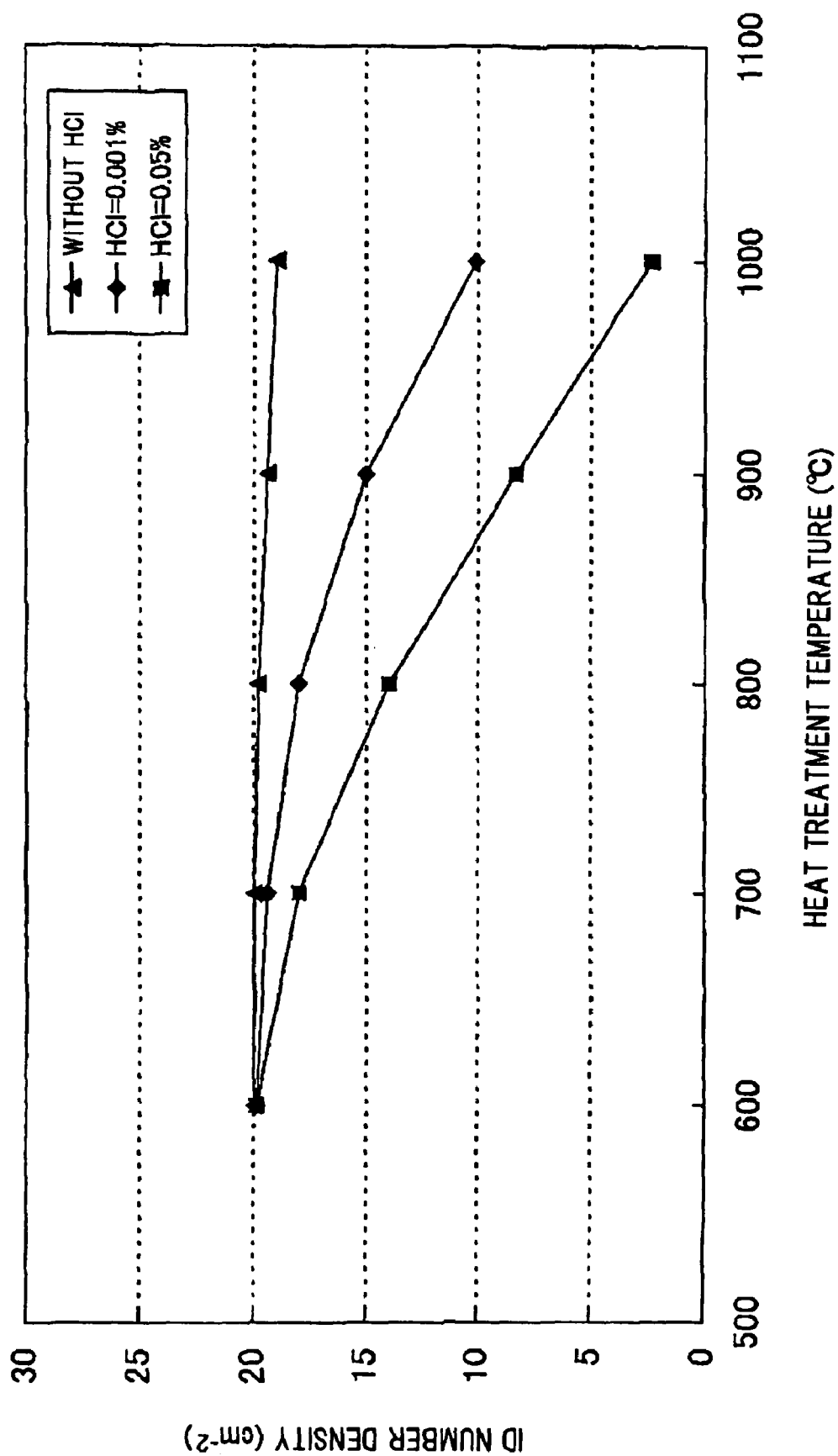
FIG. 9 is a diagram showing a relationship of inversion domain (ID) number density in a GaN single crystal to each heat treatment condition when interrupting crystal growth and performing specified heat treatment.

FIG. 9 shows a relationship of inversion domain (ID) number density in a GaN single crystal to each heat treatment condition when interrupting crystal growth and performing specified heat treatment.

First, specified heat treatment (etching) is made to a substrate obtained by the steps of FIGS. 4A-4D. Namely, specified heat treatment (etching) is made to the substrate obtained in the second growth conditions, in the following conditions. The heat treatment temperature (etching temperature) is within the range from 600° C. to 1000° C., the HCl concentration (etchant concentration) introduced into the HVPE apparatus during heat treatment is within the range from 0% to 0.05%, and heat treatment duration (etching duration) is 30 minutes.

And again, a GaN single crystal is grown on the above heated substrate, using the same growth conditions (third growth conditions) as the second growth conditions. As a result, as shown in FIG. 9, it is found that the higher the heat treatment temperature and the more the added HCl quantity, the number density of inversion domains 100 included in the formed GaN single crystal decreases. Heat treatment temperatures of not more than 600° C. have no etching effect even when adding HCl.

Namely, in the embodiment of this invention, when an inversion domain 100 is mixed in the growth crystal, by temporarily interrupting crystal growth, etching and removing the inversion domain 100 and then resuming crystal growth, it is possible to form a GaN free-standing substrate 10 with a low number density of inversion domains 100. Namely, the GaN free-standing substrate 10 is formed, in which the region in which the inversion domain 100 exists is covered with the crystal having the same orientation as that of the region in which no inversion domain 100 exists.

Concretely, interrupting crystal growth and using HCl at a relatively low temperature, the growth crystal is etched. This etching allows the region in which the inversion domain 100 exists to be selectively etched while maintaining the Ga polar face crystal region. Here, the etching temperature is set so as not to cause spontaneous thermal decomposition of both GaN and Ga polar face.

Namely, the heat treatment temperature is set such that the etching rate of the Ga polar face is smaller than the etching rate of the region in which the inversion domain 100 exists. Also, the HCl concentration used in etching is set such that the inversion domain 100 is selectively etched, i.e., the etching rate of the Ga polar face is smaller than the etching rate of the region in which the inversion domain 100 exists. Specifically, the etching temperature is set in the range of 700° C. to 900° C., and the HCl concentration is set within the range of 0.001% to 0.05%.

Figure 11:
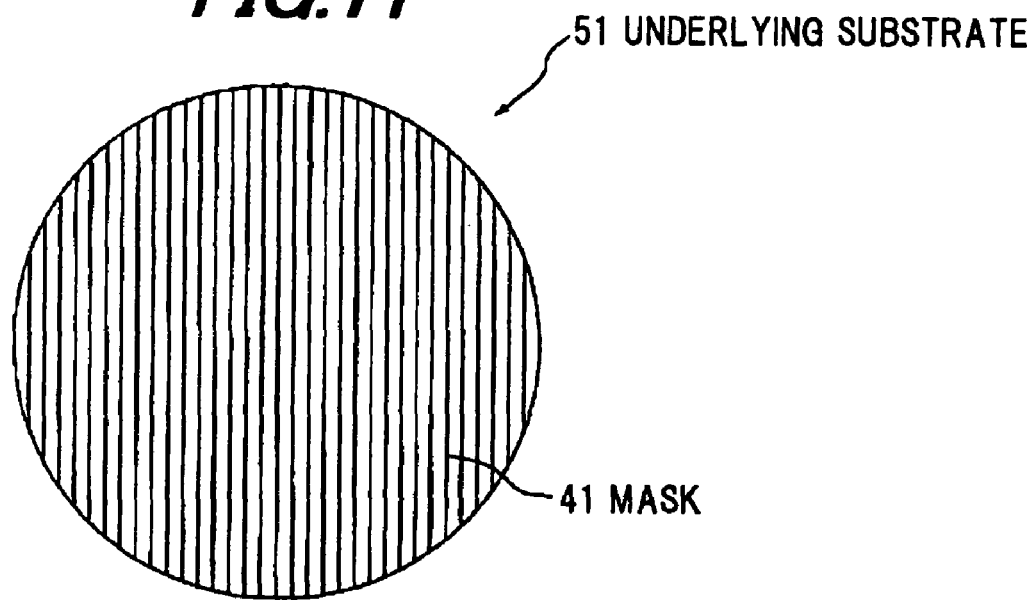
FIG. 11 is a typical top view showing an underlying substrate in the comparison example.
Figure 12:
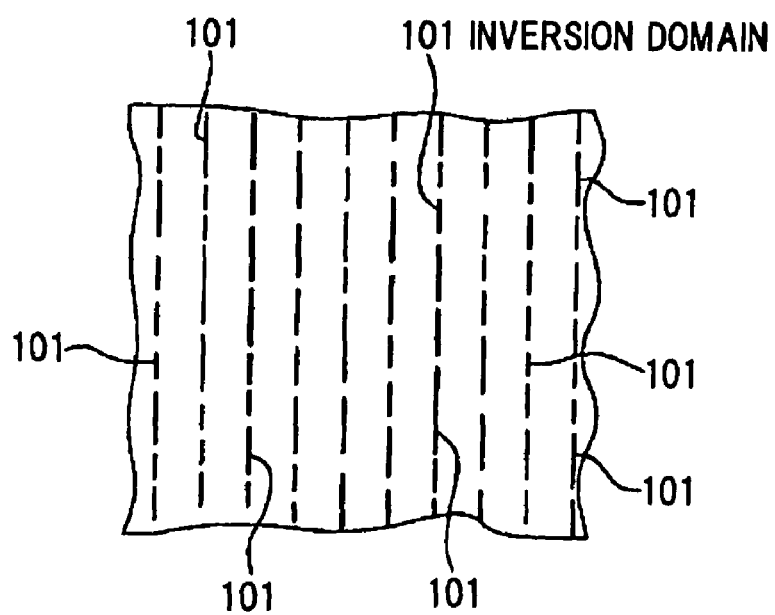
FIG. 12 is a partial enlarged view showing a frontside of the GaN free-standing substrate in the comparison example.

FIGS. 10A-10E show a process for producing a GaN free-standing substrate in a comparison example. Also, FIG. 11 is a typical top view showing an underlying substrate in the comparison example. Further, FIG. 12 is a partial enlarged view showing a frontside of the GaN free-standing substrate in the comparison example.

The process for producing a GaN free-standing substrate 12 in the comparison example are substantially the same as the process for producing a GaN free-standing substrate 10 in the embodiment of this invention, except that the shape of masks 41 of an underlying substrate 51, the growth conditions of the GaN single crystal, etc. are different. Accordingly, the detailed explanation of the comparison example is omitted except for the differences.

Figure 10A:
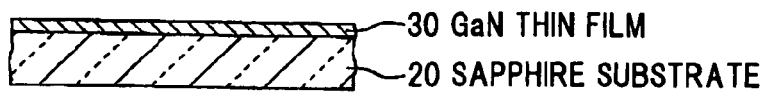
FIGS. 10A-10E are diagrams showing a process for producing a GaN free-standing substrate in a comparison example.
Figure 10B:
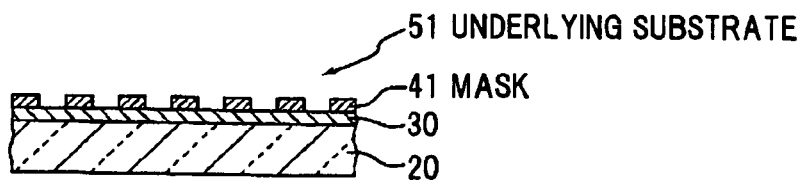

First, as shown in FIG. 10A, on a sapphire substrate 20 having a c-plane is formed a 1 μm thick GaN thin film 30 using MOVPE. This is followed by forming stripe masks 41 formed of SiO$_2$ on the GaN thin film 30 using thermal CVD. The masks 41 are formed such that the width of the masks 41 is 10 μm, and that the mask opening, i.e., the pitch between the first and second stripe masks 41 is 5 μm. This results in an underlying substrate 51 in the comparison example. Namely, as shown in FIG. 11, the underlying substrate 51 is formed that has the plural specified size and shape stripe masks 41 aligned at the specified pitch on the GaN thin film 30.

Subsequently, the underlying substrate 51 formed is introduced into an HVPE apparatus. And, using first growth conditions in the comparison example, a GaN crystal is grown on the underlying substrate 51. The first growth conditions in the comparison example are as follows. Namely, H$_2$ is used as carrier gas, and GaCl and NH$_3$ are used as raw material gas. The flow rate of GaCl is set to 20 sccm, and the flow rate of NH$_3$ is set to 1000 sccm (V/III ratio=50). And the growth temperature is set to 1040° C., and the growth pressure 100 kPa (the first growth conditions in the comparison example).

Figure 10C:
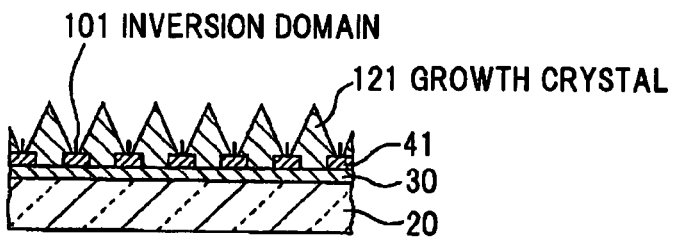
Figure 10D:
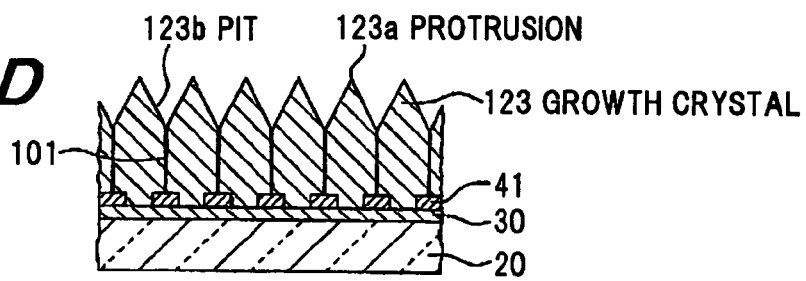

When growing a GaN single crystal in such first growth conditions in the comparison example, as shown in FIG. 10C, a growth crystal 121 as the GaN single crystal having a triangular cross section is grown from the GaN thin film 30 region having no formed masks 41. In this case, an inversion domain 101 nucleus with an N polarity is produced on the most masks 41.

This is followed by changing the GaN single crystal growth conditions in the HVPE apparatus to second growth conditions in the comparison example and growing a growth crystal 123 as the GaN single crystal. In this growth, the GaN single crystal is grown in both horizontal and normal directions to sapphire substrate 20 surface until the total thickness of the GaN single crystal reaches 1 mm.

The second growth conditions in the comparison example are as follows. Namely, $H_2$ is used as carrier gas, and GaCl and $NH_3$ are used as raw material gas. The flow rate of GaCl is set to 300 sccm, and the flow rate of $NH_3$ is set to 1500 sccm (V/III ratio=5). And the growth temperature is set to 1040° C., and the growth pressure 100 kPa (the second growth conditions in the comparison example). The opposite side of the sapphire substrate 20 of the growth crystal 123 has pits 123b with an inversion domain 101, and protrusions 123a with a Ga polarity.

Figure 10E:
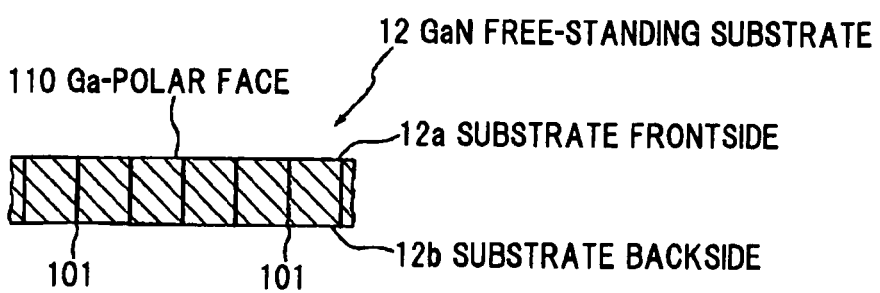

Growing the growth crystal 123 is followed by taking the sapphire substrate 20 with the growth crystal 123 out from the HVPE apparatus. And, laser lift off is used to cause a separation of the underlying substrate 51 and the growth crystal 123 (HVPE-GaN thick film) as the GaN single crystal grown. Subsequently, both sides of the GaN thick film released and obtained are ground and polished. This results in a GaN free-standing substrate 12 in the comparison example, as shown in FIG. 10E.

The GaN free-standing substrate 12 has a Ga polar face 110-exposed frontside 12a, and a backside 12b opposite the frontside 12a. And, the GaN free-standing substrate 12 in the comparison example produced in the above step has the inversion domains 101 with the number density of 25 $cm^{-2}$ and the average length of 2.5 mm.

As shown in FIG. 12, the frontside of the GaN free-standing substrate 12 in the comparison example exhibits such a shape that the plural long and thin inversion domains 101 are distributed along the stripe masks 41.

When forming a compound semiconductor stacked layer structure with a specified laser structure on this GaN free-standing substrate 12, the compound semiconductor stacked layer has plural pits formed in the central inversion domains 101 in its surface. Also, on peripheries of the plural pits are created large protrusions (abnormally grown regions) respectively. When producing an LD with a chip size of 0.5 $mm^2$ from the GaN free-standing substrate 12 in the comparison example, its cleavage surface is disturbed in its region in which the inversion domains exist, and therefore a very few normal resonators are formed. Also, the frontside 12a of the GaN free-standing substrate 12 is formed by being ground and polished, but has large pits/protrusions compared with the GaN free-standing substrate 10 in the embodiment of this invention, and therefore has poor adhesion between glass masks and the GaN free-standing substrate 12 in a photolithography process when forming the resonators, etc. For that reason, the LD chip yield obtained from the GaN free-standing substrate 12 in the comparison example is on the order of approximately 1%.

Advantages of the Embodiment

According to the GaN free-standing substrate production method in the embodiment of this invention, it is possible to reduce the number density and size of inversion domains included in the c-plane of the GaN single-crystal substrate. This allows inhibiting the occurrence of abnormal growth when epitaxially growing a specified compound semiconductor layer on the GaN free-standing substrate in this embodiment, and therefore allows yields of light-emitting devices, etc. to be enhanced tremendously.

Although in the above embodiment of this invention, the GaN free-standing substrate 10 with 50.8 mm (2 inch) diameter has been explained, a sapphire substrate with 76.2 mm (3 inch) diameter may be used as its underlying substrate. Namely, a GaN free-standing substrate with 3 inch diameter may be produced using a sapphire substrate or a GaN seed crystal substrate with 3 inch diameter as its underlying substrate, and using the same production conditions as in the embodiment of this invention. The present inventor has produced a GaN free-standing substrate with 3 inch diameter using a sapphire substrate with 3 inch diameter as its underlying substrate, and using the same production conditions as in the embodiment of this invention. Consequently, the GaN free-standing substrate with 3 inch diameter has been obtained that exhibits the same properties as those of the GaN free-standing substrate in the embodiment of this invention. The diameter of the sapphire substrate or GaN seed crystal substrate used as the underlying substrate is not limited to 2 or 3 inch, but a sapphire substrate or a GaN seed crystal substrate with a larger diameter may be used as the underlying substrate.

The embodiments of this invention have been described, but should not be construed to limit claimed inventions. Also, it should be noted that not all combinations of the features explained in the embodiments are essential to means for solving the problems of the invention.

What is claimed is:

1. A GaN single-crystal substrate, comprising:
   a substrate surface comprising a frontside and a backside; and
   polarity inversion zones extending from the frontside to the backside,
   wherein the polarity inversion zones are formed in line shapes and are concentrated in a specified position to exist in the substrate surface, and the polarity inversion zones have a number density of the polarity inversion zones in the substrate surface within a range of not more than 20 $cm^{-2}$, and
   wherein a maximum outside diameter of the polarity inversion zones is not more than 1 mm.

2. The GaN single-crystal substrate according to claim 1, wherein a ratio of a sum of respective areas of the polarity inversion zones to a total area of the substrate surface is equal to or less than 2%.

3. A GaN free-standing substrate, comprising:
   a first substrate side comprising a frontside and a backside; and
   a plurality of inversion domains extending from the frontside to the backside,
   wherein the inversion domains are formed in line shapes concentrated in a specified position to exist in the substrate surface, and the polarity inversion zones have a number density of the plurality of inversion domains within the first substrate side within a range of equal to or less than 20 $cm^{-2}$, and
   wherein the plurality of inversion domains have a maximum outside diameter equal to or less than 1 mm.

4. The GaN free-standing substrate according to claim 3, wherein a ratio of a sum of respective areas of the inversion domains to an area of the first substrate side is equal to or less than 2%.

5. The GaN free-standing substrate according to claim 3, wherein the inversion domains comprise polarity inversion zones.

6. The GaN free-standing substrate according to claim 3, further comprising:
   a second substrate side facing away from the first substrate side, wherein the inversion domains substantially extend from the first substrate side to the second substrate side.

7. The GaN free-standing substrate according to claim 3, wherein the inversion domains have N polarity.

8. The GaN single-crystal substrate according to claim 1, wherein the polarity inversion zones are accompanied by high impurity concentration regions disposed on a periphery of the polarity inversion zones, the high impurity concentration regions having a width in a range of 10 to 100 times a diameter of the polarity inversion zones.

9. The GaN free-standing substrate according to claim 3, wherein the inversion domains are accompanied by high impurity concentration regions disposed on a periphery of the inversion domains, the high impurity concentration regions having a width in a range of 10 to 100 times a diameter of the inversion domains.

10. The GaN single-crystal substrate according to claim 1, wherein the polarity inversion zones extend from an exposed area of the frontside to the backside of the substrate surface.

11. The GaN single-crystal substrate according to claim 1, wherein a region that comprises the polarity inversion, zones is inverted relative to a surrounding crystal of said region.

12. The GaN single-crystal, substrate according to claim 1, wherein a ratio of a sum of respective areas of the polarity inversion zones to a total area of the substrate frontside is equal to or less than 2%.

13. The GaN single-crystal substrate according to claim 1, wherein the polarity inversion zones are formed apart from each other on the frontside of the substrate surface.

14. The GaN single-crystal substrate according to claim 1, wherein the number density of the polarity inversion zones in the substrate surface is equal to or more than $1\ cm^{-2}$.

15. The GaN single-crystal substrate according to claim 1, wherein the number density of the polarity inversion zones in the substrate surface is more than $0\ cm^{-2}$.

* * * * *